(12) United States Patent
Majima

(10) Patent No.: US 11,360,126 B2
(45) Date of Patent: Jun. 14, 2022

(54) CURRENT DETECTING CIRCUIT

(71) Applicants: Kabushiki Kaisha Toshiba, Tokyo (JP); Toshiba Electronic Devices & Storage Corporation, Tokyo (JP)

(72) Inventor: Hideaki Majima, Tokyo (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 274 days.

(21) Appl. No.: 16/542,697

(22) Filed: Aug. 16, 2019

(65) Prior Publication Data
US 2020/0209287 A1 Jul. 2, 2020

(30) Foreign Application Priority Data

Dec. 26, 2018 (JP) .............................. JP2018-243301

(51) Int. Cl.
*G01R 19/00* (2006.01)
*H03K 5/24* (2006.01)
*H03K 17/0812* (2006.01)

(52) U.S. Cl.
CPC ........... *G01R 19/0069* (2013.01); *H03K 5/24* (2013.01); *H03K 17/08122* (2013.01)

(58) Field of Classification Search
None
See application file for complete search history.

(56) References Cited

U.S. PATENT DOCUMENTS

| 7,995,319 B2 | 8/2011 | Kojima | |
| 2013/0162232 A1* | 6/2013 | Itoh | H02M 3/158 323/271 |
| 2014/0027785 A1* | 1/2014 | Rose | H01L 27/06 257/77 |
| 2015/0061752 A1 | 3/2015 | Abe | |

FOREIGN PATENT DOCUMENTS

| JP | H10-032476 A | 2/1998 |
| JP | 2008-294984 A | 12/2008 |
| JP | 2009-277930 A | 11/2009 |
| JP | 5800986 B2 | 10/2015 |
| JP | 2016-201693 A | 12/2016 |
| WO | 2015-166523 A1 | 11/2015 |

* cited by examiner

*Primary Examiner* — Daniel C Puentes
(74) *Attorney, Agent, or Firm* — Allen & Overy LLP

(57) ABSTRACT

According to one embodiment, a current detecting circuit includes: a normally-ON type first switching element that includes a drain, a source, and a gate; a normally-OFF type second switching element including a drain that is connected to the source of the first switching element, a source that is connected to the gate of the first switching element, and a gate; and a differential amplification circuit that outputs a voltage according to a voltage between the drain and the source of the second switching element.

7 Claims, 9 Drawing Sheets

CURRENT DETECTING CIRCUIT

CROSS-REFERENCE TO RELATED APPLICATIONS

This application is based upon and claims the benefit of priority from Japanese Patent Application No. 2018-243301, filed on Dec. 26, 2018; the entire contents of which are incorporated herein by reference.

FIELD

Embodiments described herein relate generally to a current detecting circuit.

BACKGROUND

Conventionally, there has been disclosed a semiconductor device including a normally-ON type switching element and a normally-OFF type switching element that are cascode-connected. For example, the normally-ON type switching element is constituted of a transistor that is made from Gallium Nitride (GaN) and/or Silicon Carbide (SiC). By employing the normally-ON type switching element made from GaN and/or SiC, it is possible to provide a semiconductor device having high withstand voltage and low energy loss. On the other hand, when the normally-ON type switching element is provided, for example, there may present a case where output current of the semiconductor device is not able to be precisely detected in response to leakage current of the normally-ON type switching element. Thus, there has been desired a current detecting circuit having a high reliability, which is able to precisely detect the output current while taking advantage of characteristics of the semiconductor device including a normally-ON type switching element.

DETAILED DESCRIPTION

According to one embodiment, a current detecting circuit includes: a normally-ON type first switching element that includes a drain, a source, and a gate; a normally-OFF type second switching element including a drain that is connected to the source of the first switching element, a source that is connected to the gate of the first switching element, and a gate; and a differential amplification circuit that outputs a voltage according to a voltage between the drain and the source of the second switching element.

Exemplary embodiments of a current detecting circuit will be explained below in detail with reference to the accompanying drawings. The present invention is not limited to the following embodiments.

First Embodiment

Figure 1:
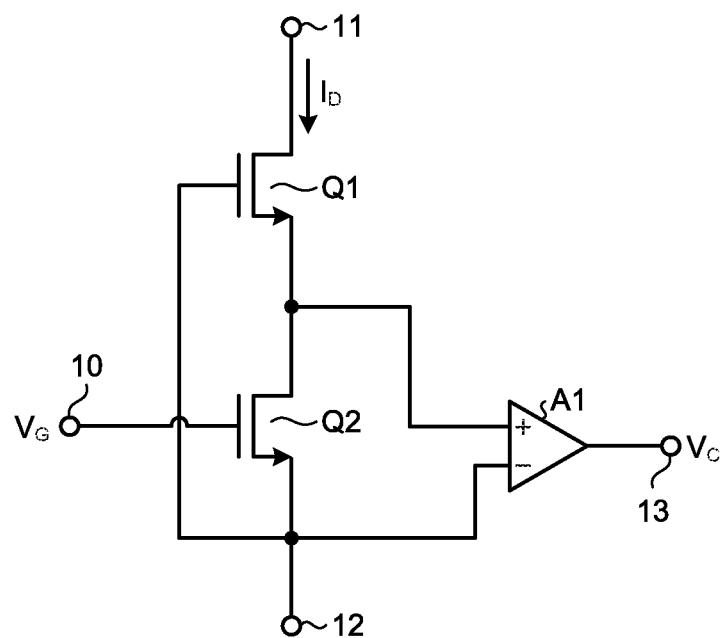
FIG. 1 is a diagram illustrating a current detecting circuit according to a first embodiment.

FIG. 1 is a diagram illustrating a current detecting circuit according to a first embodiment. A current detecting circuit according to the present embodiment includes a normally-ON type switching element Q1. The switching element Q1 is constituted of an N-channel MOS transistor made from, for example, GaN. For example, a main current path between a drain and a source of the MOS transistor made from GaN is made of GaN. Hereinafter, the MOS transistor may be referred to as a GaN transistor.

A normally-OFF type switching element Q2 is constituted of an N-channel MOS transistor made from, for example, Si. For example, a main current path between a drain and a source of the MOS transistor made from Si is made of Si. Hereinafter, the MOS transistor may be referred to as an Si transistor. A drain of the switching element Q1 is connected to a terminal 11. The terminal 11 is connected to a power-source line (not illustrated) to which a voltage of 600V is applied, for example. A source of the switching element Q1 is connected to a drain of the switching element Q2.

A source of the switching element Q2 is connected to a terminal 12. To the terminal 12, a ground potential is supplied, for example. A gate of the switching element Q2 is connected to a terminal 10. To the terminal 10, a drive signal $V_G$ is applied.

The drain of the switching element Q2 is connected to a non-inversion input end (+) of a differential amplification circuit A1, and the source of the switching element Q2 is connected to an inversion input end (−) of the differential amplification circuit A1. The differential amplification circuit A1 outputs an output voltage $V_C$ to a terminal 13.

A current detecting operation according to the present embodiment will be described below. Changing, into High, the drive signal $V_G$ that is applied to the gate of the switching element Q2 causes turning ON of the switching element Q2. A drain-source voltage $V_{DS}$ of the switching element Q2 at this time is indicated by a formula (1).

$$V_{DS} = R_{ON} \times I_D \quad (1)$$

$R_{ON}$ indicates an ON-resistance of the switching element Q2, and $I_D$ indicates an output current $I_D$ flowing through the switching element Q1. Current flowing through the switching element Q2 is substantially equal to current flowing through the switching element Q1, and thus the current flowing through the switching element Q2 becomes current that is substantially equal to the output current $I_D$. Hereinafter, for convenience of explanation, a drain current $I_D$ of the switching element Q1 may be used as the output current $I_D$.

The output voltage $V_C$ of the differential amplification circuit A1 may be indicated by the following formula (2)

$$V_C = A \times R_{ON} \times I_D \tag{2}$$

where "A" indicates a voltage gain of the differential amplification circuit A1.

For example, the voltage of the drive signal $V_G$, which is to be applied to the gate of the switching element Q2, is set such that a relation between a gate-source voltage $V_{GS}$ and a drain-source voltage $V_{DS}$ of the switching element Q2 is "$V_{GS} \gg V_{DS}$", and the set voltage is supplied to the switching element Q2 so as to turn ON the switching element Q2, so that it is possible to cause the switching element Q2 to operate in a linear region. When the switching element Q2 operates in the linear region, the drain-source voltage $V_{DS}$ of the switching element Q2 is the voltage that is proportional to the output current $I_D$, as a result, it is possible to cause the differential amplification circuit A1 to output the output voltage $V_C$ that is proportional to the output current $I_D$. Thus, it is possible to precisely detect the output current $I_D$ when the switching element Q2 is being driven.

According to the present embodiment, the voltage, which is according to the drain-source voltage $V_{DS}$ of the switching element Q2 operating in the linear region, is output by the differential amplification circuit A1, so that it is possible to precisely detect the output current $I_D$ flowing into the normally-ON type switching element Q1 when the switching element Q2 is being driven.

Figure 2:
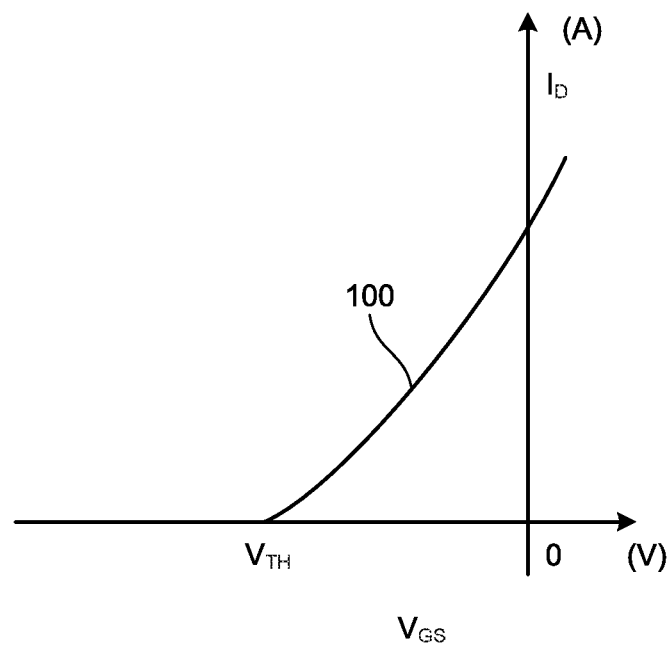
FIG. 2 is a diagram illustrating characteristics of a normally-ON type switching element.

FIG. 2 is a diagram illustrating characteristics of the normally-ON type switching element. In other words, characteristics of the above-mentioned switching element Q1 according to the first embodiment are illustrated. In FIG. 2, the gate-source voltage $V_{GS}$ is indicated on the lateral axis, and the drain current $I_D$ is indicated on the vertical axis. A characteristic curve 100 indicates that the drain current $I_D$ flows even when the gate-source voltage $V_{GS}$ is substantially zero (0) V, and the drain current $I_D$ is substantially zero (0) A when the gate-source voltage $V_{GS}$ becomes a minus threshold voltage $V_{TH}$.

Second Embodiment

Figure 3:
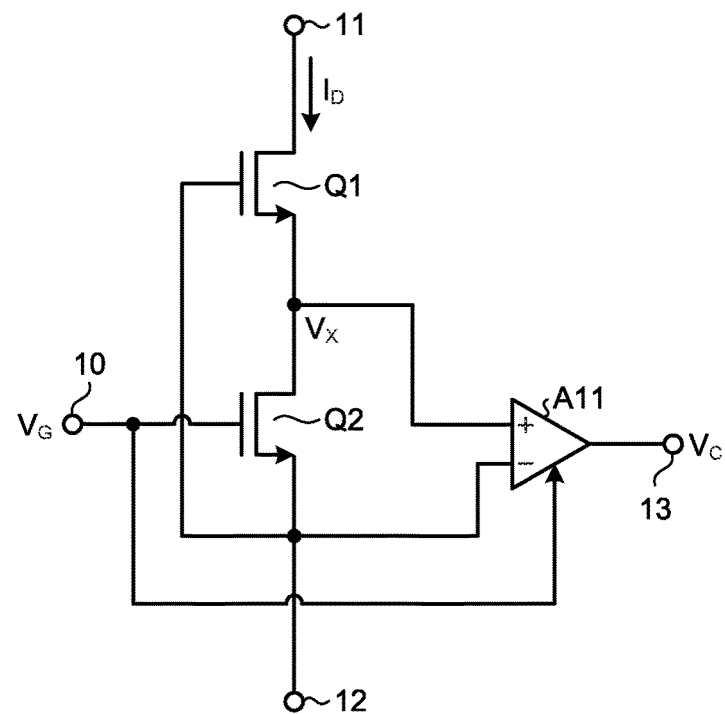
FIG. 3 is a diagram illustrating a current detecting circuit according to a second embodiment.

FIG. 3 is a diagram illustrating a current detecting circuit according to a second embodiment. Note that in the following, a part different from the above-mentioned embodiment will be mainly described, and the common parts are represented with same symbols and the description is omitted appropriately. The same applies hereinafter. Turning ON/OFF of a differential amplification circuit A11 according to the present embodiment is controlled by the drive signal $V_G$ that is applied to the gate of the switching element Q2. Specifically, the differential amplification circuit A11 is in an operation state (ON) when the drive signal $V_G$ applied to the gate of the switching element Q2 is High, and is in a non-operation state (OFF) when the drive signal $V_G$ is Low. For example, when the drive signal $V_G$ is Low, control for turning OFF a bias circuit (not illustrated) of the differential amplification circuit A11 is executed.

The switching element Q1 has a normally-ON characteristic, and thus the drain current $I_D$ flows even in a state where a ground potential applied to the terminal 12 is supplied to the gate of the switching element Q1. Thus, when the drive signal $V_G$ applied to the gate of the switching element Q2 is Low, in other words, when the switching element Q2 is OFF, a drain voltage $V_X$ of the switching element Q2 rises.

According to the present embodiment, when the drive signal $V_G$ applied to the gate of the switching element Q2 is Low, the control is executed in which operation of the differential amplification circuit A11 is turned OFF. Therefore, in a case where the drive signal $V_G$ is Low, the differential amplification circuit A11 is OFF even when the drain voltage $V_X$ of the switching element Q2 has risen, and thus, for example, 0V is output. Thus, it is possible to prevent an erroneous detection of an overcurrent state responding to leakage current of the normally-ON type switching element Q1. Furthermore, control for causing the differential amplification circuit A11 to operate is executed only when the switching element Q2 is in a driving state, so that it is possible to reduce the power consumption.

Third Embodiment

Figure 4:
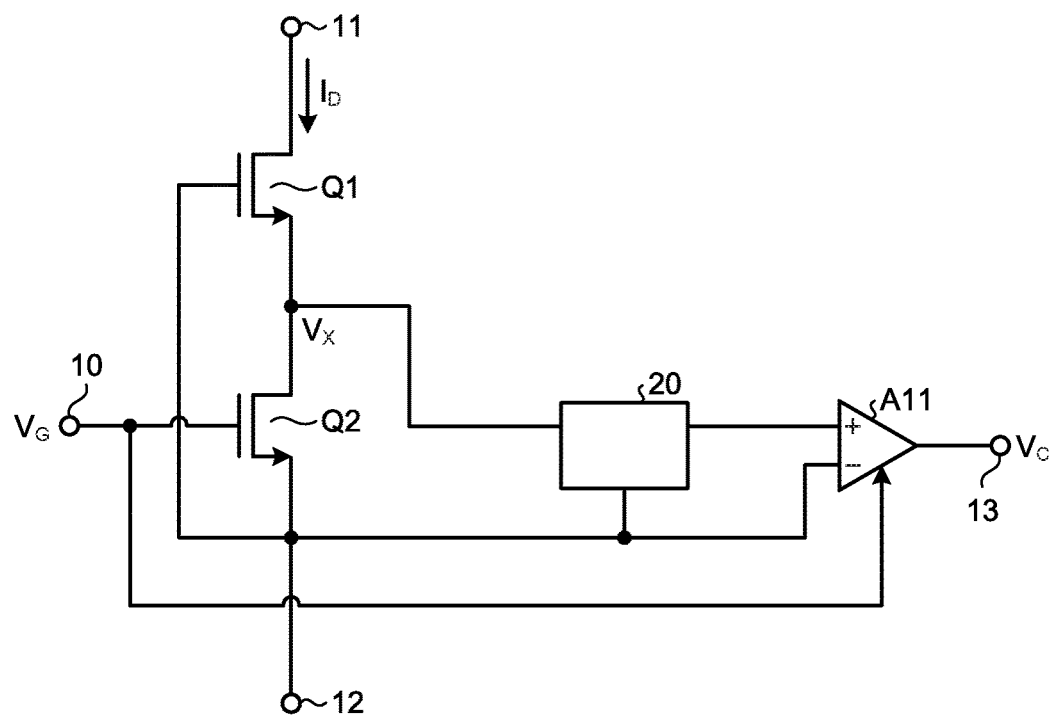
FIG. 4 is a diagram illustrating a current detecting circuit according to a third embodiment.

FIG. 4 is a diagram illustrating a current detecting circuit according to a third embodiment. An adjustment circuit 20 according to the present embodiment adjusts a voltage between the drain and the source of the switching element Q2 and supplies the adjusted voltage to the differential amplification circuit A11. The adjustment circuit 20 performs voltage division on, for example, the drain voltage $V_X$ of the switching element Q2, and supplies the divided voltage to the differential amplification circuit A11.

The switching element Q1 has a normally-ON characteristic, and thus the drain voltage $V_X$ of the switching element Q2 rises when the switching element Q2 is OFF. There presents a case where a high voltage (for example, 600V) is applied to the terminal 11 in some cases while taking advantage of the characteristic of the normally-ON type switching element Q1. Thus, there presents a case where, when the switching element Q2 is OFF, the drain voltage $V_X$ of the switching element Q2 becomes a high voltage.

According to the present embodiment, the drain voltage $V_X$ of the switching element Q2 is adjusted and the adjusted voltage is supplied to the differential amplification circuit A11. Therefore, applying of overvoltage to the differential amplification circuit A11 is able to be prevented, so that it is possible to prevent a failure in the differential amplification circuit A11 due to the applying of overvoltage and further it is possible to improve the reliability. Moreover, by employing a configuration in which the drain voltage $V_X$ of the switching element Q2 is adjusted and the adjusted voltage is supplied to the differential amplification circuit A11, it is possible to configure the differential amplification circuit A11 with a low-withstand voltage, and further possible to simplify the circuit configuration and the manufacturing process of a semiconductor device equipped with the current detecting circuit.

Figure 5:
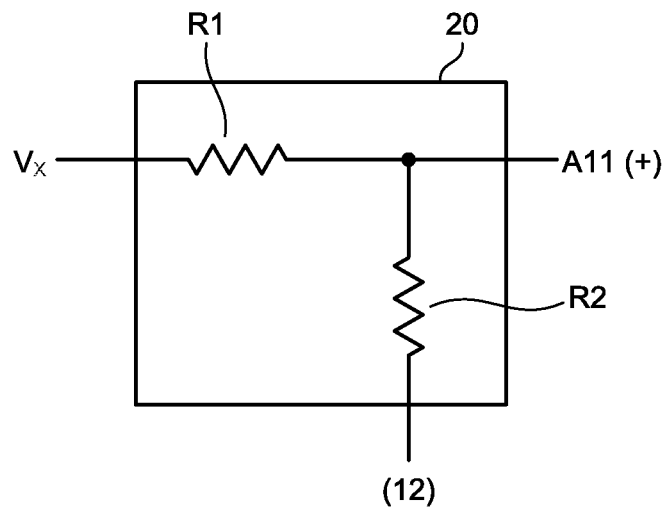
FIG. 5 is a diagram illustrating a configuration example of an adjustment circuit.

FIG. 5 is a diagram illustrating a configuration example of the adjustment circuit 20. The adjustment circuit 20 according to the present configuration example includes (i) a fixed resistance R1 to one end of which the drain voltage $V_X$ of the switching element Q2 is applied and the other end of which is connected to a non-inversion input end (+) of the differential amplification circuit A11; and (ii) a fixed resistance R2 one end of which is connected to the non-inversion input end (+) of the differential amplification circuit A11 and the other end of which is connected to the terminal 12.

The drain voltage $V_X$ of the switching element Q2 is adjusted by voltage division, which is performed by the serial circuit of the fixed resistance R1 and the fixed resistance R2, and the adjusted voltage is supplied to the non-inversion input end (+) of the differential amplification circuit A11. Thus, when a voltage-dividing ratio is adjusted by obtaining desired values of resistance values of the fixed resistance R1 and the fixed resistance R2, it is possible to prevent a case where an overvoltage is applied to the non-inversion input end (+) of the differential amplification circuit A11.

Fourth Embodiment

Figure 6:
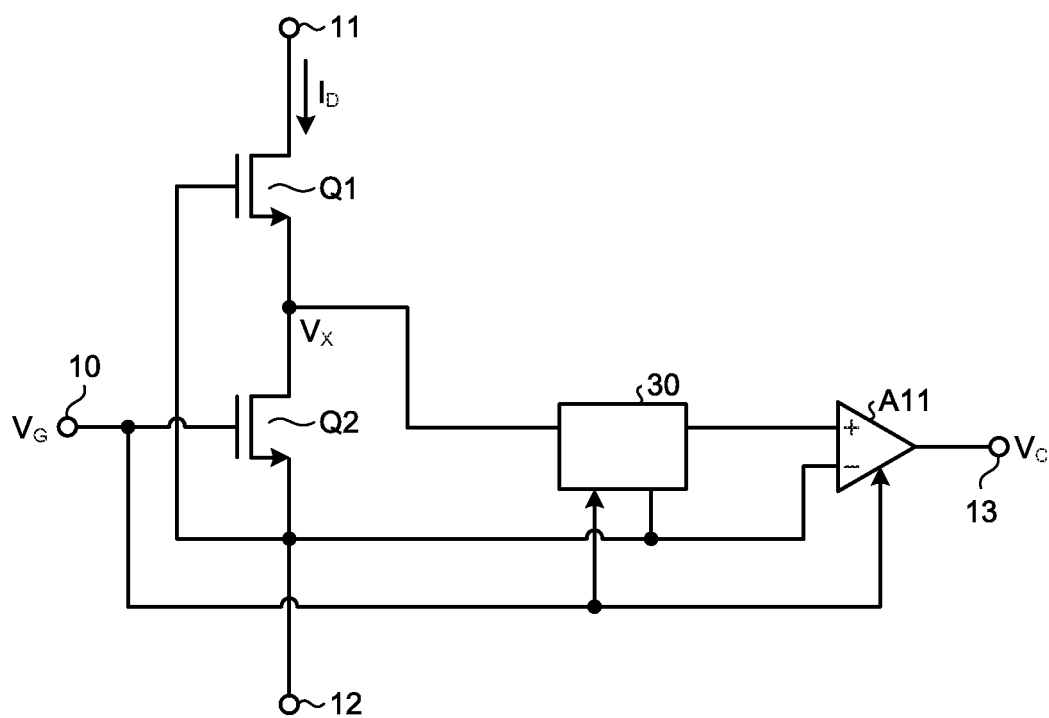
FIG. 6 is a diagram illustrating a current detecting circuit according to a fourth embodiment.

FIG. 6 is a diagram illustrating a current detecting circuit according to a fourth embodiment. An adjustment circuit 30 according to the present embodiment adjusts, in accordance with the drive signal $V_G$ applied to the gate of the switching element Q2, the drain voltage $V_X$ of the switching element Q2, and supplies the adjusted voltage to the differential amplification circuit A11.

The adjustment circuit 30 executes adjustment in which an attenuation amount of the drain voltage $V_X$ to be supplied to the differential amplification circuit A11 is reduced when the drive signal $V_G$ applied to the gate of the switching element Q2 is High, in other words, in a driving state where the switching element Q2 is turned ON; and in which the attenuation amount of the drain voltage $V_X$ to be supplied to the differential amplification circuit A11 is increased when the drive signal $V_G$ applied to the gate of the switching element Q2 is Low, in other words, when the switching element Q2 is OFF.

The output current $I_D$ is able to be appropriately detected in a driving state obtained by controlling the adjustment circuit 30 in accordance with the drive signal $V_G$ applied to the gate of the switching element Q2, adjusting the drain voltage $V_X$ of the switching element Q2, and supplying the adjusted voltage to the differential amplification circuit A11 so as to turning ON the switching element Q2. Hereinafter, a specific configuration example will be explained.

Figure 7:
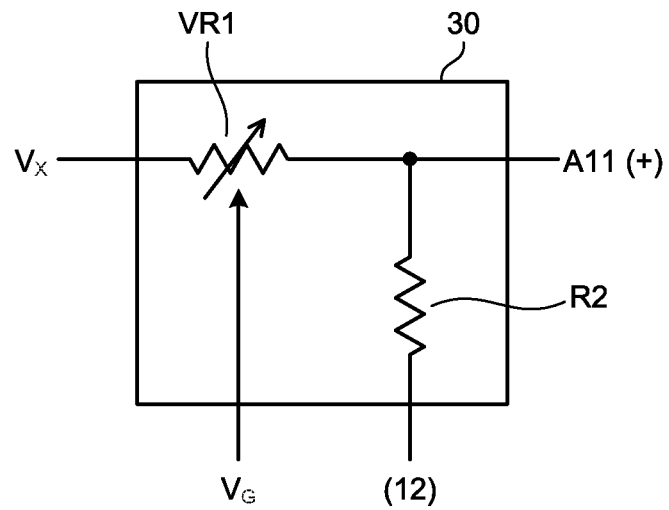
FIG. 7 is a diagram illustrating another configuration example of the adjustment circuit.

FIG. 7 is a diagram illustrating a configuration example of the adjustment circuit 30. The present configuration example is provided with a variable resistance VR1 whose resistance value is adjusted by the drive signal $V_G$, and the fixed resistance R2. A resistance value of the variable resistance VR1 is reduced when the drive signal $V_G$ is High, and is increased when the drive signal $V_G$ is Low. Hence, when the drive signal $V_G$ is High and the switching element Q2 is in a driving state, a control for reducing an attenuation amount of the drain voltage $V_X$ is executed, and when the drive signal $V_G$ is Low, a resistance value of the variable resistance VR1 is increased to attenuate the drain voltage $V_X$ and the attenuated voltage is supplied to the differential amplification circuit A11, so that it is possible to prevent a case where overvoltage is supplied to the differential amplification circuit A11.

When the drive signal $V_G$ is High, in other words, in a case of a driving state obtained by turning ON the switching element Q2, a control for reducing an attenuation amount of the drain voltage $V_X$ is executed. In other words, when "VR1" is assumed to be a resistance value of the variable resistance VR1 and "R2" is assumed to be a resistance value of the fixed resistance R2, a voltage-dividing ratio [=resistance value of fixed resistance R2/(resistance value of variable resistance VR1+resistance value of fixed resistance R2)] becomes large, and thus an attenuation amount of the drain voltage $V_X$ is reduced to be able to supply the attenuated voltage to the differential amplification circuit A11. Therefore, it is possible to output the output voltage $V_C$ on which the drain-source voltage $V_{DS}$ of the switching element Q2, generated in proportion to the output current $I_D$, is precisely reflected. Thus, it is further possible to precisely detect the output current $I_D$ when the switching element Q2 is turned into a driving state.

A resistance value of the variable resistance VR1 is reduced and thus a change in the drain voltage $V_X$ is able to be rapidly transmitted to the differential amplification circuit A11, so that it is possible to improve a response speed of the differential amplification circuit A11 to be able to rapidly detect a change in the output current $I_D$.

Furthermore, a resistance value of the variable resistance VR1 is increased when the drive signal $V_G$ is Low, a voltage-dividing ratio, which is derived from the variable resistance VR1 and the fixed resistance R2, is reduced, and thus the drain voltage $V_X$ is attenuated and the attenuated voltage is supplied to the differential amplification circuit A11. Thus, it is possible to prevent a case where an overvoltage is supplied to the differential amplification circuit A11 when the switching element Q2 is OFF.

For example, in a case where a switch (not illustrated) is connected to a resistance in parallel and the switch is turned ON when the drive signal $V_G$ is High, a configuration is able to be realized in which a resistance value of the variable resistance VR1 is reduced when the drive signal $V_G$ is High.

Figure 8:
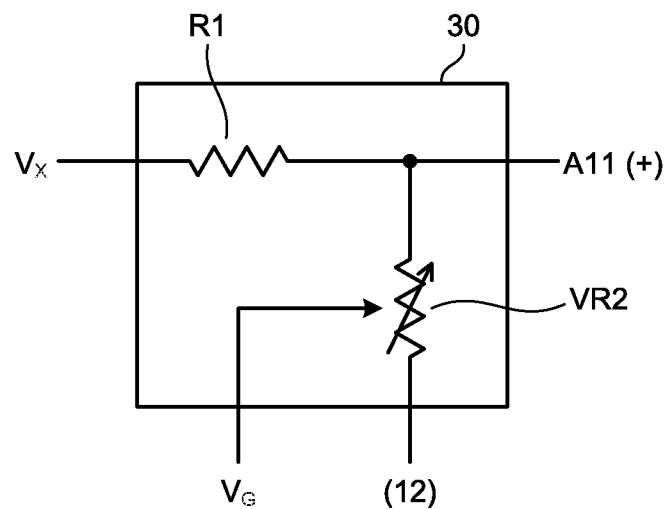
FIG. 8 is a diagram illustrating another configuration example of the adjustment circuit.

FIG. 8 is a diagram illustrating another configuration example of the adjustment circuit 30. The present configuration example is provided with the fixed resistance R1, and a variable resistance VR2 whose resistance value is adjusted by the drive signal $V_G$. A resistance value of the variable resistance VR2 is increased when the drive signal $V_G$ is High, and is reduced when the drive signal $V_G$ is Low.

In other words, a resistance value of the variable resistance VR2 is increased when the drive signal $V_G$ is High to drive the switching element Q2, a voltage-dividing ratio [=resistance value of variable resistance VR2/(resistance value of fixed resistance R1+resistance value of variable resistance VR2)] of the fixed resistance R1 and the variable resistance VR2 becomes large, so that it is possible to reduce an attenuation amount of the drain voltage $V_X$ so as to supply the voltage to the differential amplification circuit A11. Therefore, it is possible to output the output voltage $V_C$ on which the drain-source voltage $V_{DS}$ of the switching element Q2, generated in proportion to the output current $I_D$, is precisely reflected. Thus, it is further possible to precisely detect the output current $I_D$ when the switching element Q2 is turned into a driving state.

Furthermore, a resistance value of the variable resistance VR2 is reduced when the drive signal $V_G$ is Low, a voltage-dividing ratio derived from the fixed resistance R1 and the variable resistance VR2 becomes small, and thus the drain voltage $V_X$ is largely attenuated to be supplied to the differential amplification circuit A11. Thus, it is possible to prevent a case where an overvoltage is supplied to the differential amplification circuit A11 when the switching element Q2 is OFF.

Figure 9:
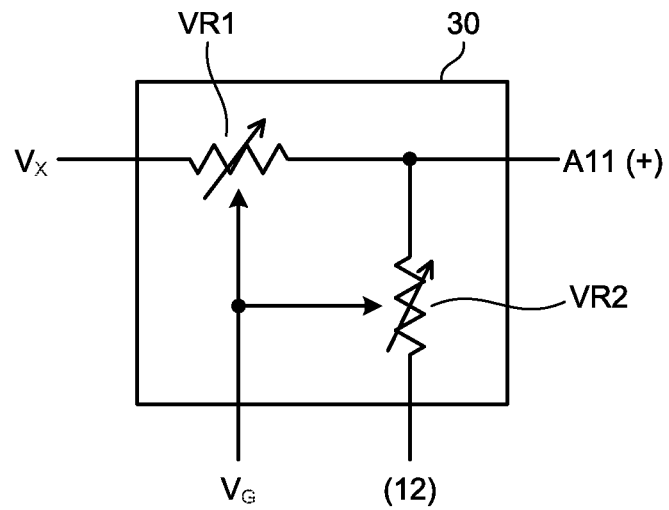
FIG. 9 is a diagram illustrating another configuration example of the adjustment circuit.

FIG. 9 is a diagram illustrating another configuration example of the adjustment circuit 30. The present configuration example is provided with the variable resistance VR1 and the variable resistance VR2 whose resistance values are adjusted by the drive signal $V_G$. A resistance value of the variable resistance VR1 is reduced when the drive signal $V_G$ is High, and is increased when the drive signal $V_G$ is Low. A resistance value of the variable resistance VR2 is increased when the drive signal $V_G$ is High, and is reduced when the drive signal $V_G$ is Low.

By employing such a configuration, when the drive signal $V_G$ is changed into High to drive the switching element Q2, a resistance value of the variable resistance VR1 is reduced and a resistance value of the variable resistance VR2 is increased, and a control for increasing a voltage-dividing ratio [=resistance value of variable resistance VR2/(resistance value of variable resistance VR1+resistance value of variable resistance VR2)] derived from the variable resistance VR1 and the variable resistance VR2 so as to reduce an attenuation amount of the drain voltage $V_X$ is executed; and when the drive signal $V_G$ is Low, a resistance value of the variable resistance VR1 is increased and a resistance value of the variable resistance VR2 is reduced, and a control for reducing the voltage-dividing ratio derived from the variable resistances VR1 and VR2 to increase an attenuation amount of the drain voltage $V_X$ and supplying the voltage to the differential amplification circuit A11 is executed.

By employing the adjustment of an attenuation amount of the drain voltage $V_X$, which is executed by the adjustment circuit 30 in accordance with the drive signal $V_G$, when the switching element Q2 is driven with the drive signal $V_G$ being High, it is possible to output the output voltage $V_C$ on which the drain-source voltage $V_{DS}$ of the switching element Q2, generated in proportion to the output current $I_D$, is precisely reflected. Moreover, when the drive signal $V_G$ is Low, the drain voltage $V_X$ is largely attenuated to be supplied to the differential amplification circuit A11, so that it is possible to prevent a case where an overvoltage is supplied to the differential amplification circuit A11 when the switching element Q2 is OFF.

For example, the variable resistance VR1 may have a configuration including a parallel circuit constituted of a fixed resistance and a switch (not illustrated), and the variable resistance VR2 may have a configuration including a parallel circuit constituted of a fixed resistance and a switch (not illustrated). A configuration may be employed in which, when the drive signal $V_G$ is High, a switch, constituting the variable resistance VR1, is turned ON to reduce a resistance value of the variable resistance VR1, and when the drive signal $V_G$ is Low, a switch, constituting the variable resistance VR2, is turned ON to reduce a resistance value of the variable resistance VR2.

Figure 10:
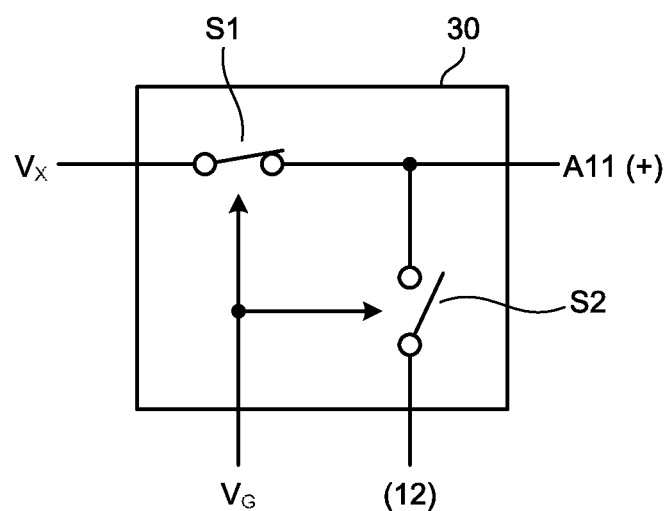
FIG. 10 is a diagram illustrating another configuration example of the adjustment circuit.

FIG. 10 is a diagram illustrating another configuration example of the adjustment circuit 30. The present configuration example is provided with switches S1 and S2 whose turning ON/OFF is controlled by the drive signal $V_G$. The switch S1 is turned ON when the drive signal $V_G$ is High, and the switch S2 is turned ON when the drive signal $V_G$ is Low.

By employing such a configuration, when the drive signal $V_G$ is changed into High to drive the switching element Q2, the switch S1 is turned ON and the switch S2 is turned OFF. When the switch S1 is turned ON, a resistance value of the switch S1 is able to be neglected, when the switch S2 is turned OFF, a resistance value of the switch S2 becomes infinite, and thus when the drive signal $V_G$ is changed into High to drive the switching element Q2, the drain voltage $V_X$ is able to be directly supplied to a non-inversion input terminal (+) of the differential amplification circuit A11 without attenuation.

Thus, when the drive signal $V_G$ is changed into High to drive the switching element Q2, the drain voltage $V_X$ is directly applied to the non-inversion input terminal (+) of the differential amplification circuit A11, and thus when the drain voltage $V_X$ generated in accordance with the output current $I_D$ is detected by the differential amplification circuit A11, the output current $I_D$, when the switching element Q2 is driven, is able to be precisely detected.

Moreover, a resistance value of the switch S1 when the switch S1 is ON is able to be neglected, and thus a change in the drain voltage $V_X$ when the switching element Q2 is in a driving state is able to be rapidly transmitted to the differential amplification circuit A11, so that it is possible to rapidly detect a change in the output current $I_D$.

Furthermore, the switch S1 is turned OFF in a state where the drive signal $V_G$ is Low, a supply route of the drain voltage $V_X$ to the differential amplification circuit A11 is shut. Thus, it is possible to prevent a case where an overvoltage is applied to the differential amplification circuit A11 when the switching element Q2 is OFF.

Each of the switches S1 and S2 may be constituted of a switching element such as a MOS transistor and a bipolar transistor, and turning ON/OFF thereof may be controlled by the drive signal $V_G$.

Fifth Embodiment

Figure 11:
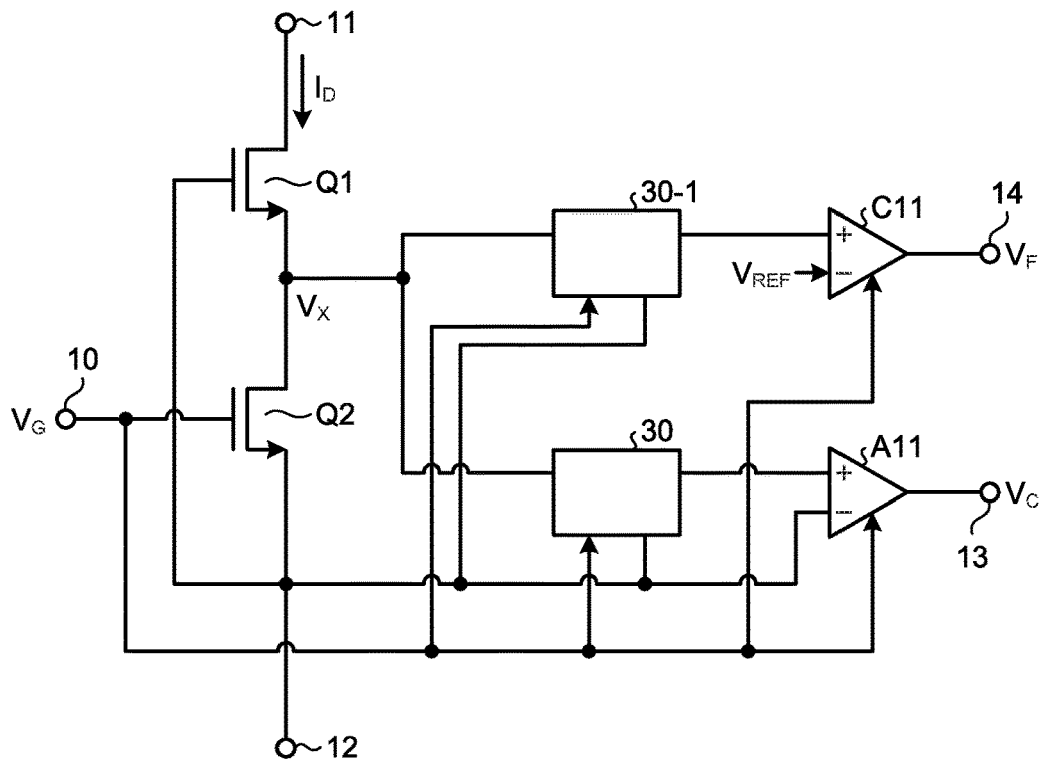
FIG. 11 is a diagram illustrating a current detecting circuit according to a fifth embodiment.

FIG. 11 is a diagram illustrating a current detecting circuit according to a fifth embodiment. The present embodiment is provided with a comparison circuit C11 that compares the drain voltage $V_X$ with a predetermined reference voltage $V_{REF}$. The comparison circuit C11 has a configuration in which a gain of the comparison circuit C11 is higher than a gain of the differential amplification circuit A11, and its response speed is rapid, for example. The comparison circuit C11 may have a configuration without a feedback loop, for example.

The reference voltage $V_{REF}$ is applied to an inversion input end (−) of the comparison circuit C11. The drain voltage $V_X$ is supplied, via an adjustment circuit 30-1, to a non-inversion input end (+) of the comparison circuit C11. The adjustment circuit 30-1 has a configuration that is the same as that of the adjustment circuit 30, and may have any one of the above-mentioned configurations illustrated in FIGS. 7 to 10.

When the drive signal $V_G$ becomes High and the voltage supplied via the adjustment circuit 30-1 is higher than the reference voltage $V_{REF}$, the comparison circuit C11 supplies, to a terminal 14, an output signal $V_F$ that is High. In other words, when a voltage according to the drain voltage $V_X$, generated in accordance with the output current $I_D$, is higher than the reference voltage $V_{REF}$, the comparison circuit C11 outputs the output signal $V_F$ that is High.

The drain voltage $V_X$ is proportional to the output current $I_D$. Therefore, the comparison circuit C11 compares a voltage, which is according to the drain voltage $V_X$, with the reference voltage $V_{REF}$, which is set as a threshold value for detecting overcurrent, to be able to perform the overcurrent detection.

By employing a configuration in which the drain voltage $V_X$ is supplied, via the adjustment circuit 30-1, to the comparison circuit C11, it is possible to realize a configuration in which an attenuation amount of the drain voltage $V_X$ is reduced and the voltage is supplied to the comparison circuit C11 in a state where the drive signal $V_G$ is High and the switching element Q2 is in a driving state, so as to precisely detect the output current $I_D$ when the switching element Q2 is in a driving state, and when the drive signal $V_G$ is Low and the switching element Q2 is OFF, a state where an overvoltage is applied to the comparison circuit C11 is prevented. Furthermore, it is possible to employ a configuration for executing a control for supplying the output signal $V_F$, output from the comparison circuit C11, to a control circuit (not illustrated), and stopping applying of the drive signal $V_G$ in response to the output signal $V_F$ that indicates an overcurrent state, for example.

Sixth Embodiment

Figure 12:
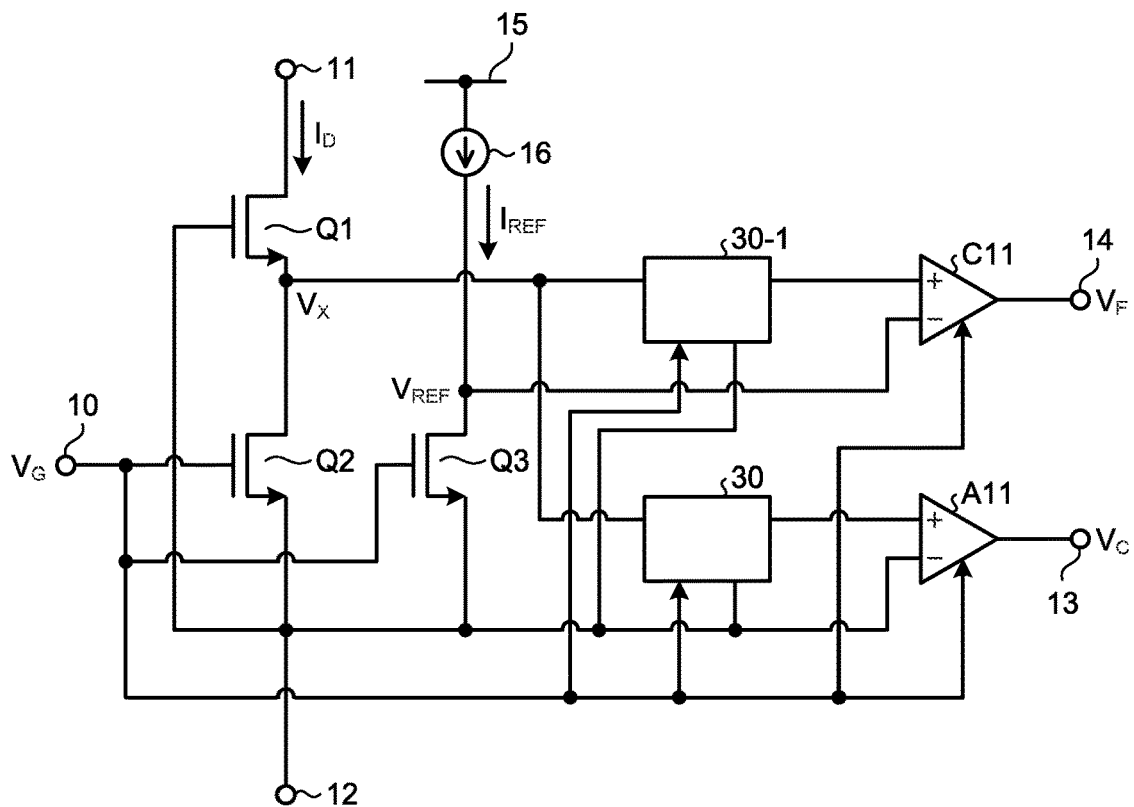
FIG. 12 is a diagram illustrating a current detecting circuit according to a sixth embodiment.

FIG. 12 is a diagram illustrating a current detecting circuit according to a sixth embodiment. The present embodiment is provided with a constant-current source 16 that is connected to a power terminal 15, and a switching element Q3 to which a constant current $I_{REF}$ of the constant-current source 16 is supplied. The constant-current source 16 is constituted of a bandgap circuit (not illustrated), for example. A drain of the switching element Q3 is connected to the inversion input end (−) of the comparison circuit C11, a source of the switching element Q3 is connected to the terminal 12, and the drive signal $V_G$ is applied to a gate of the switching element Q3.

The switching element Q3 is formed on a semiconductor substrate (not illustrated) on which the switching element Q2 is formed. The switching elements Q2 and Q3 are formed on the same semiconductor substrate, and thus characteristics of both of the switching elements Q2 and Q3 are able to be matched, so that it is possible to cancel difference between the characteristics, for example.

A size of a gate width of the switching element Q3 is set to 1/N (N: arbitrary positive number) of a size of a gate width of the switching element Q2, for example. In a case of such a setting, when a drain current of the switching element Q2 is "N" times as large as a drain current of the switching element Q3, the drain-source voltages $V_{DS}$ of both of the switching elements Q2 and Q3 become the same. Thus, it is possible to realize a configuration in which a drain voltage of the switching element Q3 is supplied, as the reference voltage $V_{REF}$, to the comparison circuit C11, and thus the comparison circuit C11 outputs the output signal $V_F$ indicating High when a drain current flowing into the switching element Q2 exceeds a value that is "N" times as large as a value of the constant current $I_{REF}$.

According to the present embodiment, the output current $I_D$, when the drive signal $V_G$ is High and the switching element Q2 is in an operation state, is able to be detected by using the output voltage $V_C$ of the differential amplification circuit A11, furthermore, a value of the constant current $I_{REF}$ is set as, for example, a threshold current for detecting an overcurrent, so that it is possible to detect, by using the output signal $V_F$ of the comparison circuit C11, an overcurrent state in a case where the output current $I_D$ exceeds a current value that is "N" times as large as the constant current $I_{REF}$.

Seventh Embodiment

Figure 13:
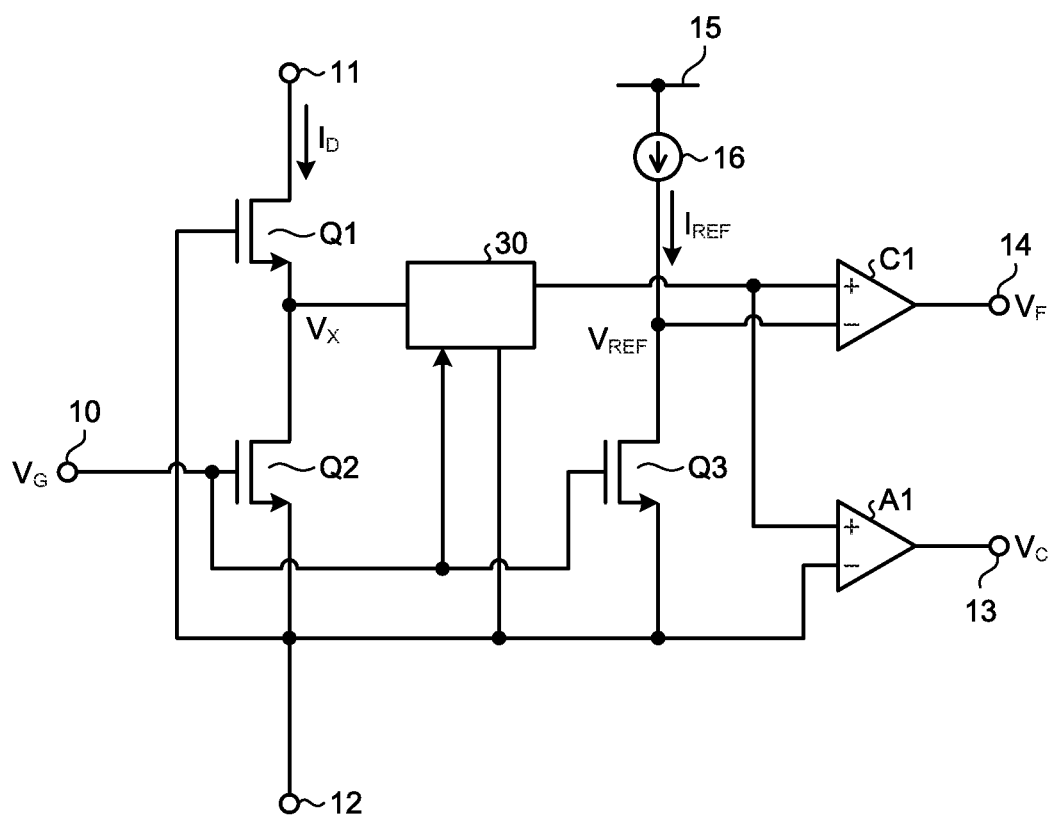
FIG. 13 is a diagram illustrating a current detecting circuit according to a seventh embodiment.

FIG. 13 is a diagram illustrating a current detecting circuit according to a seventh embodiment. The present embodiment is provided with the adjustment circuit 30 that is shared by the differential amplification circuit A1 and a comparison circuit C1. The adjustment circuit 30 may employ any of the above-mentioned configurations illustrated in FIGS. 7 to 10. When the adjustment circuit 30 is shared, it is possible to reduce the number of circuit elements to realize cost reduction.

In the present embodiment, a control for turning ON/OFF the differential amplification circuit A1 and the comparison circuit C1 by using the drive signal $V_G$ is not executed. As described above, a configuration is employed in which the drain voltage $V_X$ is supplied, via the adjustment circuit 30, to the differential amplification circuit A1 and the comparison circuit C1, and when the drive signal $V_G$ is High, attenuation of the drain voltage $V_X$ is reduced to supply the voltage to the differential amplification circuit A1 and the comparison circuit C, when the drive signal $V_G$ is Low, an attenuation amount of the drain voltage $V_X$ is increased or supply routes to the differential amplification circuit A1 and the comparison circuit C1 are shut, so that it is possible to prevent a case where an overvoltage is applied to the differential amplification circuit A1 and the comparison circuit C1.

Eighth Embodiment

Figure 14:
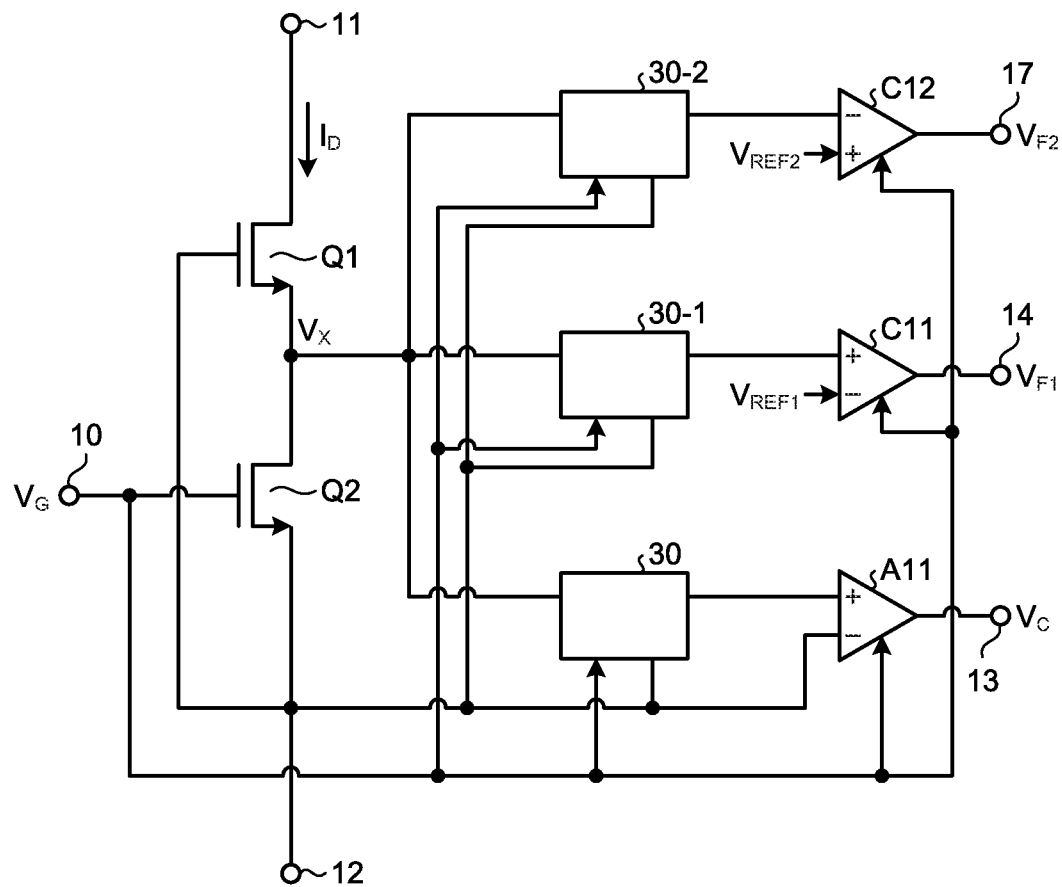
FIG. 14 is a diagram illustrating a current detecting circuit according to an eighth embodiment.

FIG. 14 is a diagram illustrating a current detecting circuit according to an eighth embodiment. The present embodiment is provided with the comparison circuit C11 that compares the drain voltage $V_X$, which is supplied via the adjustment circuit 30-1, with a reference voltage $V_{REF1}$; and a comparison circuit C12 that compares the drain voltage $V_X$, which is supplied via an adjustment circuit 30-2, with a reference voltage $V_{REF2}$.

The drain voltage $V_X$ is supplied, via the adjustment circuit 30-2, to an inversion input end (−) of the comparison circuit C12, and the reference voltage $V_{REF2}$ is supplied to a non-inversion input end (+) of the comparison circuit C12. Therefore, when the drain voltage $V_X$, which is supplied via the adjustment circuit 30-2, is reduced less than the reference voltage $V_{REF2}$, the comparison circuit C12 supplies, to a terminal 17, a signal $V_{F2}$ indicating High level. Thus, it is possible to detect a state where a reverse-direction drain current flows into the switching element Q2 and the drain voltage $V_X$ is reduced to less than the reference voltage $V_{REF2}$ due to a voltage drop generated by the switching element Q2, namely, a reverse-direction overcurrent state. The reference voltage $V_{REF2}$ may be set to an arbitrary negative voltage in accordance with a threshold of a current value that is set as an overcurrent state.

According to the present embodiment, it is possible to precisely detect the output current $I_D$ when the drive signal $V_G$ is High and the switching element Q2 is in a driving state by using the differential amplification circuit A11, furthermore, to detect a forward-direction overcurrent state and a reverse-direction overcurrent state of the output current $I_D$. In the present embodiment, a configuration is employed in which operation states of the differential amplification circuit A11, and the comparison circuits C11 and C12 are controlled by using the drive signal $V_G$. Thus, in the configuration, the differential amplification circuit A11, and the comparison circuits C11 and C12 operate only in a state where the drive signal $V_G$ is High, so that it is possible to reduce power consumption. Note that, a configuration may be employed in which a control for turning ON/OFF using the drive signal $V_G$ is not executed on the differential amplification circuit A11 and the comparison circuits C11 and C12.

Ninth Embodiment

Figure 15:
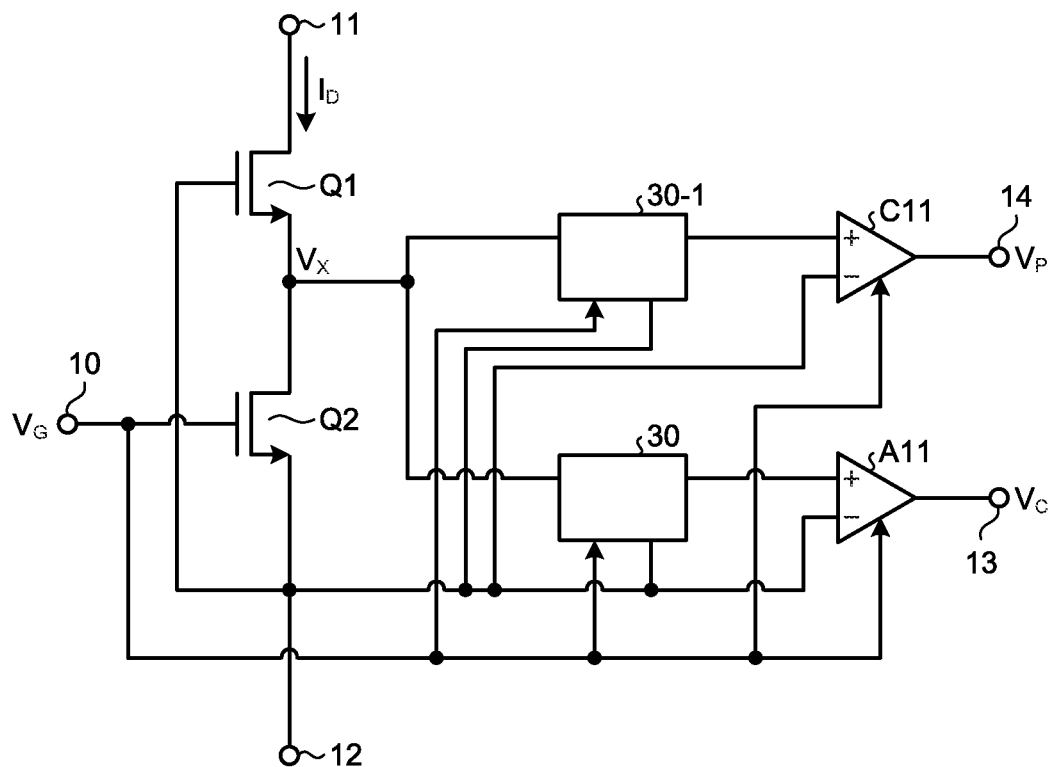
FIG. 15 is a diagram illustrating a current detecting circuit according to a ninth embodiment.

FIG. 15 is a diagram illustrating a current detecting circuit according to a ninth embodiment. The present embodiment is provided with the comparison circuit C11 having a non-inversion input end (+) to which the drain voltage $V_X$ is supplied via the adjustment circuit 30-1 and having an inversion input end (−) that is connected to the terminal 12. The adjustment circuit 30-1 may employ any of the above-mentioned configurations illustrated in FIGS. 7 to 10.

The comparison circuit C11 outputs, to the terminal 14, an output signal $V_P$ indicating High when a voltage supplied to its non-inversion input end (+) is higher than a voltage supplied to its inversion input end (−), and outputs the output signal $V_P$ indicating Low level when a voltage supplied to the non-inversion input end (+) is lower than the voltage supplied to the inversion input end (−). When a direction of drain current of the switching element Q2 is a forward direction, a voltage of the non-inversion input end (+) of the comparison circuit C11 becomes higher than a voltage of the inversion input end (−), and when a direction of the drain current of the switching element Q2 is a reverse direction, a voltage of the non-inversion input end (+) of the comparison circuit C11 becomes lower than a voltage of the inversion input end (−). Therefore, a direction of drain current is able to be determined by a level of the output signal $V_P$ of the comparison circuit C11, so that it is possible to use the comparison circuit C11 as a zero-cross detecting circuit.

According to the present embodiment, it is possible to precisely detect, by using the output voltage $V_C$ of the differential amplification circuit A11, the output current $I_D$ when the drive signal $V_G$ is High and the switching element Q2 is in a driving state, furthermore, it is possible to execute a zero-cross detection by using the output signal $V_P$ of the comparison circuit C11.

In the above-mentioned embodiment, the configuration is employed in which the differential amplification circuits A1 and A11, each of which outputs a voltage according to the drain-source voltage $V_{DS}$ of the switching element Q2, output the single output voltage $V_C$; however, the configuration may output a pair of differential signals of a positive side and a negative side.

The normally-ON type switching element Q1 may be constituted of a Junction Field Effect Transistor (JFET).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A current detecting circuit comprising:
   a normally-ON type first switching element that includes a drain, a source, and a gate;
   a normally-OFF type second switching element including:
      a drain that is connected to the source of the first switching element;
      a source that is connected to the gate of the first switching element; and
      a gate;
   a differential amplification circuit that outputs a voltage according to a voltage between the drain and the source of the second switching element; and
   an adjustment circuit that is arranged between the drain of the second switching element and an input terminal of the differential amplification circuit, the adjustment circuit adjusting a drain voltage of the second switching element to supply an adjusted drain voltage to the differential amplification circuit, wherein
   one input end of the adjustment circuit is connected to the drain of the second switching element and another input end of the adjustment circuit is connected to the gate of the first switching element.

2. The current detecting circuit according to claim 1, wherein
   the adjustment circuit includes a switch that responds to a drive signal applied to the gate of the second switching element.

3. The current detecting circuit according to claim 1, wherein
   the adjustment circuit includes a variable resistance that is connected between the drain of the second switching element and the input terminal of the differential amplification circuit, and
   a resistance value of the variable resistance is changed by a drive signal applied to the gate of the second switching element.

4. The current detecting circuit according to claim 1, wherein
   the adjustment circuit includes a variable resistance that is connected between the input terminal of the differential amplification circuit and the source of the second switching element, and
   a resistance value of the variable resistance is changed by a drive signal applied to the gate of the second switching element.

5. The current detecting circuit according to claim 1, wherein
   the adjustment circuit includes:
      a first variable resistance that is connected between the input terminal of the differential amplification circuit and the drain of the second switching element, a resistance value of the first variable resistance being changed by a drive signal applied to the gate of the second switching element; and
      a second variable resistance that is connected between the input terminal of the differential amplification circuit and the source of the second switching element, a resistance value of the second variable resistance being changed by the drive signal applied to the gate of the second switching element, and
   when the resistance value of the first variable resistance is reduced, the resistance value of the second variable resistance is increased.

6. The current detecting circuit according to claim 1, wherein
   the adjustment circuit includes:
      a first switch that is connected between the input terminal of the differential amplification circuit and the drain of the second switching element, turning ON/OFF of the first switch being controlled by a drive signal applied to the gate of the second switching element; and
      a second switch that is connected between the input terminal of the differential amplification circuit and the source of the second switching element, turning ON/OFF of the second switch being controlled by the drive signal applied to the gate of the second switching element, and
   the second switch is turned OFF when the first switch is turned ON.

7. A current detecting circuit comprising:
   a normally-ON type first switching element that includes a drain, a source, and a gate;
   a normally-OFF type second switching element including:
      a drain that is connected to the source of the first switching element;

a source that is connected to the gate of the first switching element; and a gate; and a differential amplification circuit that outputs a voltage according to a voltage between the drain and the source of the second switching element, wherein turning ON/OFF of the differential amplification circuit is controlled by a drive signal that is applied to the gate of the second switching element.

\* \* \* \* \*